United States Patent [19]

Price et al.

[11] Patent Number: 5,680,297
[45] Date of Patent: Oct. 21, 1997

[54] CONNECTOR INTERFACE INCLUDING EMI FILTERING

[75] Inventors: Noah M. Price, Campbell; David Hudson Titzler, Newbury Park; R. Stephen Polzin, Morgan Hill, all of Calif.

[73] Assignee: Apple Computer, Inc., Cupertino, Calif.

[21] Appl. No.: 511,640

[22] Filed: Aug. 7, 1995

[51] Int. Cl.[6] ............................................. H05K 9/00
[52] U.S. Cl. .......................... 361/818; 361/753; 361/800; 439/609; 439/610
[58] Field of Search ........................... 361/728, 733, 361/734, 738, 753, 785, 799, 800, 816, 818; 333/1, 12, 181; 439/608, 609, 610

Primary Examiner—Leo P. Picard
Assistant Examiner—Anthony Dinkins
Attorney, Agent, or Firm—Burns, Doane, Swecker & Mathis, L.L.P.

[57] ABSTRACT

A computer system connector panel including EMI filtering on the computer system housing connector panel instead of on the system motherboard so that I/O signals are filtered just before being transmitted out of the computer system housing thereby reducing EMI affects on external A/V devices.

13 Claims, 2 Drawing Sheets

CONNECTOR INTERFACE INCLUDING EMI FILTERING

FIELD OF THE INVENTION

The present invention relates to an electrical system connector panel and particularly to a computer system connector panel. More particularly, the invention relates to employing EMI filtering on the computer system connector panel.

BACKGROUND OF THE INVENTION

A computer system is designed to interface with many different input and output (I/O) devices (e.g. a keyboard, a monitor, and/or a printer). An external I/O device and a computer system are electrically connected with a cable that plugs into a connector backplate or panel on the computer system housing. The computer system housing holds a printed circuit board (often referred to as the motherboard) that supports and interconnects the computer system circuitry. The motherboard generally includes a central processing unit (CPU), integrated circuit (IC) memory devices, I/O driver ICs, and many other miscellaneous components and ICs. I/O signals are transmitted between the motherboard and the back of the connector panel with a wire connector such as a ribbon cable connector. Once coupled to the connector panel the I/O signals may be passed to external I/O devices through the ports of the panel to each of the I/O device cables.

Many types of data may be passed between the motherboard circuitry and external I/O devices. The type of data being transmitted determines which type of connector port and connector is used to transmit the data. For instance, a serial I/O port supports serial communication (i.e. one bit of data at a time) between an I/O device and the computer system. This type of port is commonly used to connect a printer or modem to the computer system. A small computer system interface (SCSI) port is a standardized port that provides high-speed communication between the computer system and several parallel peripheral devices such as hard disks, tape drives, high-speed line printers and optical disks. This port type is often internally connected to the motherboard SCSI bus that uses a protocol communication system to enable high speed parallel communication. An Ethernet port allows for passing data between other computer systems and information sources. The Ethernet port is connected to the motherboard Ethernet bus via the ribbon cable. Other port types can also accommodate analog input and output sound signals.

Each port type is often associated with a standardized connector type. For instance serial ports are often 9 pin mini DIN jacks and SCSI ports are DB-25 jacks.

One design aspect of the personal computer (PC) is to design a system for the non-technical user that is easy to interact with. With this in mind, some prior art computer system connector panels have been designed so that minimal confusion occurs when connecting I/O cable connectors to the connector panel. For instance, each port - having an associated computer functionality (i.e. printer port, monitor port, microphone port, modem port) - is physically differentiated from all other ports so that only the correct connector may be plugged into the correct port.

However, due to a recent technical evolution in which PC manufacturers have increased the functionality of the PC to process audio and video (A/V) data, new ports have been added to the connector panel of the PC causing some confusion to the user as to where to connect certain cables on the connector panel.

For instance, one particular A/V capable personal computer, the Macintosh Quadra 840AV, is designed such that the computer function ports and A/V function ports on the connector panel are intermixed. Specifically, the ports are configured in a vertical column in the following random order: SCSI port, Ethernet port, speaker port, microphone port, S-video (out) port, monitor port, S-video (in) port, modem port, printer port, ADB port. The video -in and -out ports are situated adjacent to the monitor port. As configured, the A/V ports and computer ports are not clearly distinguishable to the user when connecting external computer and A/V devices to the computer system.

To add to the above described confusion, some of the A/V ports are physically the same as the computer ports, making it possible for non-technical users to erroneously plug A/V function connectors into the pre-existing computer function panel ports. For instance, it is common for both the A/V function S-video (in) and (out) ports and computer function ADB port to both use a 4 pin mini DIN connector.

Still another problem that occurs as a result of the PC gaining A/V capability is that signals being transmitted between the computer system and external devices are more susceptible to electro-magnetic interference (EMI). Specifically, in a computer system using high frequency video signals and also having a CPU operating at a frequency in the range of the video signals, EMI, internally generated by the motherboard, may affect the signals being transmitted to the video equipment that the computer system is interacting with.

One manner in which to thwart the problems of EMI is to use a shielded box to house the computer system motherboard. This minimizes the emission of A/V signals through the walls of the computer system housing. EMI may also be reduced by placing a filter on the motherboard to filter out unwanted interference signals other than the desired A/V signals to be transmitted out of the system housing. The problem with this technique is that the filtering is done on the motherboard before the signals are passed through the ribbon cable to the connector panel. The ribbon cable picks up EMI much like an antenna, distorting the A/V signal. Consequently, the A/V signal passed out through the ribbon cable to the connector panel and then to the external A/V device is still affected by the EMI despite the EMI filtering performed on the motherboard. Although an EMI shielded cable, such as a coaxial cable, could be used to transmit each signal between the motherboard and the connector panel instead of a ribbon cable, this solution is regarded as being cost prohibitive, particularly in the case in which many signals are being coupled between the motherboard and the interconnect panel.

Another manner in which to deal with the EMI picked up by the ribbon cable is to design the motherboard layout such that devices that drive the signals transmitted on the ribbon cable are placed at the edge of the motherboard - closest to the connector panel. This reduces the ribbon cable length thereby minimizing the EMI picked up by the cable connection between the motherboard and panel. However, this method is not effective enough to reduce levels to an acceptable level when EMI is significant. In addition, since there is limited space at the edge of the motherboard it is not always possible to use this technique to minimize EMI. Finally, this technique often limits the flexibility of the motherboard layout design.

The present invention is an interface and an interface method for reducing EMI emission from a computer system housing.

SUMMARY OF THE INVENTION

The present invention is an electrical system interface and interface method that performs electro-magnetic interference (EMI) filtering just prior to transmitting signals out of the electrical system housing. According to the interface and interface method of the present invention at least one EMI filter is placed on the electrical system housing connector interface so that signals are EMI filtered just before leaving the housing of the electrical system. The connector panel and interface method of the present invention is particularly applicable to a computer system that includes circuitry having very high frequency operating signals that are in the operating frequency range of the signals that are driving the external device that it is interfacing with. In one embodiment, the system is a computer system and the EMI signals are in the video frequency range.

DETAILED DESCRIPTION

The present invention is a system interface and interface method for reducing EMI emission from an electrical system. In the following description, numerous specific details are set forth, such as connector and connector port types, in order to provide a thorough understanding of the present invention. It will be apparent, however, to one skilled in the art that these specific details need not be employed to practice the present invention. In other instances, well-known computer system structures have not been described in detail in order to avoid unnecessarily obscuring the present invention.

The present invention is a connector panel including electromagnetic interference (EMI) filtering. Due to the recent addition of A/V functions to the PC, the A/V capable computer system needs to be able to pass EMI standards as set forth by appropriate regulatory agencies, such as the Federal Communication Committee (FCC) in the United States. In essence, the FCC standard dictates that EMI emitted from a system (e.g. VCR or computer) must be kept at or below a specified level such that it does not interfere with A/V signals being transmitted to an external A/V device in the general vicinity.

In a system housing holding a motherboard including a CPU and video device, processor signals from the CPU are transmitted between other ICs on the mother board along metal traces. Processor signals in the metal traces emit electro-magnetic interference (EMI) around the traces and in the general area above the motherboard in the computer system housing. In the case in which the CPU's operating frequency is not in the range of the video signal, processor signal generated EMI emitted from the motherboard has minimal effect on the video signals. However, EMI generated by processor signals operating in a frequency close to the video signal can cause interference in the external video signal and can greatly reduce the performance of the external A/V device. Since high operating frequency processors are commonly available in A/V capable computer systems, it is necessary to reduce or minimize emission of EMI caused by the system processor.

One well know technique for reducing EMI emission in an electrical system is to use an enclosed shielded housing. This technique reduces emission from the system housing. Another prior art manner in which EMI emission is reduced, is to use filters on the motherboard or in the system circuitry to filter out the EMI in a given frequency range.

Figure 1:
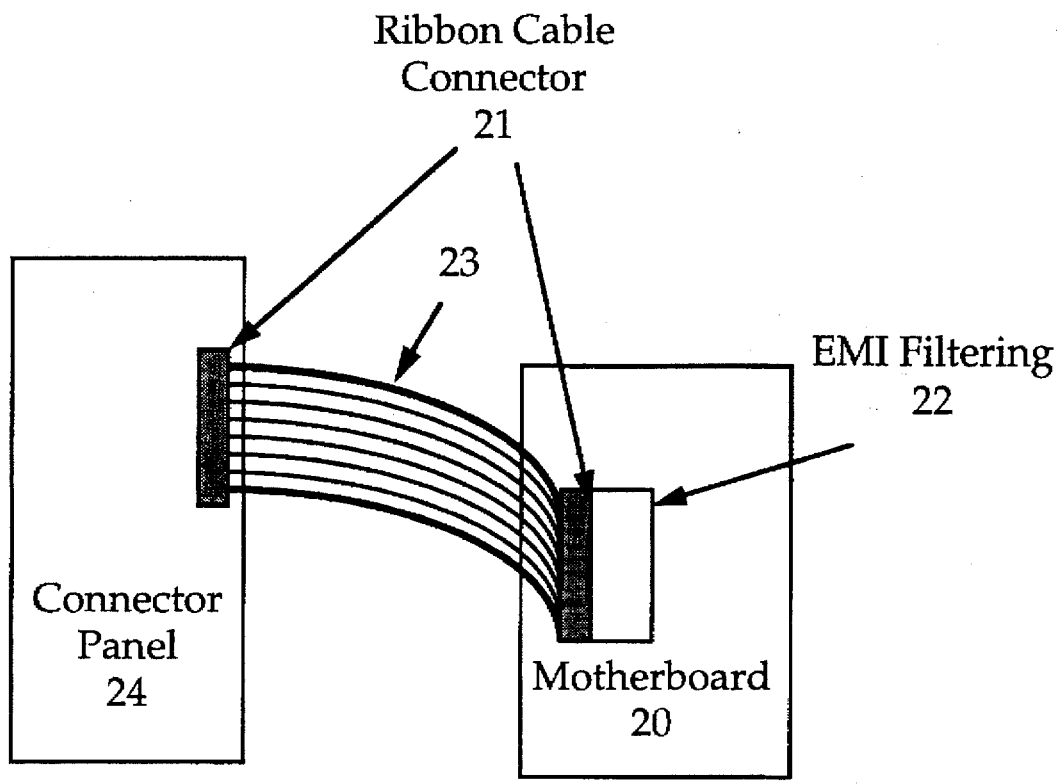
FIG. 1 shows a prior art system including a motherboard having EMI filtering, a ribbon connector, and a connector panel.

FIG. 1 illustrates a prior art electrical system comprising a motherboard 20 including EMI filtering 22. If the system has A/V capabilities, the motherboard may include a video integrated circuit (IC) device and a CPU along with other system IC devices employed by the electrical system. The video IC device processes video signals and couples them to one or more buses that are first filtered by filter 22 and then transmitted through ribbon cable 23 to connector panel 24. Ribbon cable 23 is attached to each of the connector panel and motherboard with a ribbon cable connector 21. Signals are transmitted from ribbon cable 23 through a port on connector panel 24 to an external A/V device (such as a television) with a standard cable connector. In the case in which motherboard 20 includes both a video IC device and a CPU, the video signal may be in a frequency range of 25 MHz and the CPU's operating frequency can be in a range close to that of the video signal (e.g. 100 Mhertz range).

The above described prior art EMI filtering technique has been effective in prior art computer systems that do not include both video devices generating video signals and CPUs having very high operating frequencies in the same range as the video signals. However, in the case in which an electrical system (such as a computer system) is processing and generating two different signals in the same frequency range (such as CPU signals and video signals), the ribbon cable connecting the motherboard and the connector panel residing within the space above the motherboard acts as an antenna picking up the EMI emitted from the motherboard. This EMI is then transmitted along ribbon cable 23 and out connector panel 24 to the external A/V device. Consequently, the prior art technique of filtering EMI on the motherboard is ineffective when EMI is generated in this manner.

Figure 2:
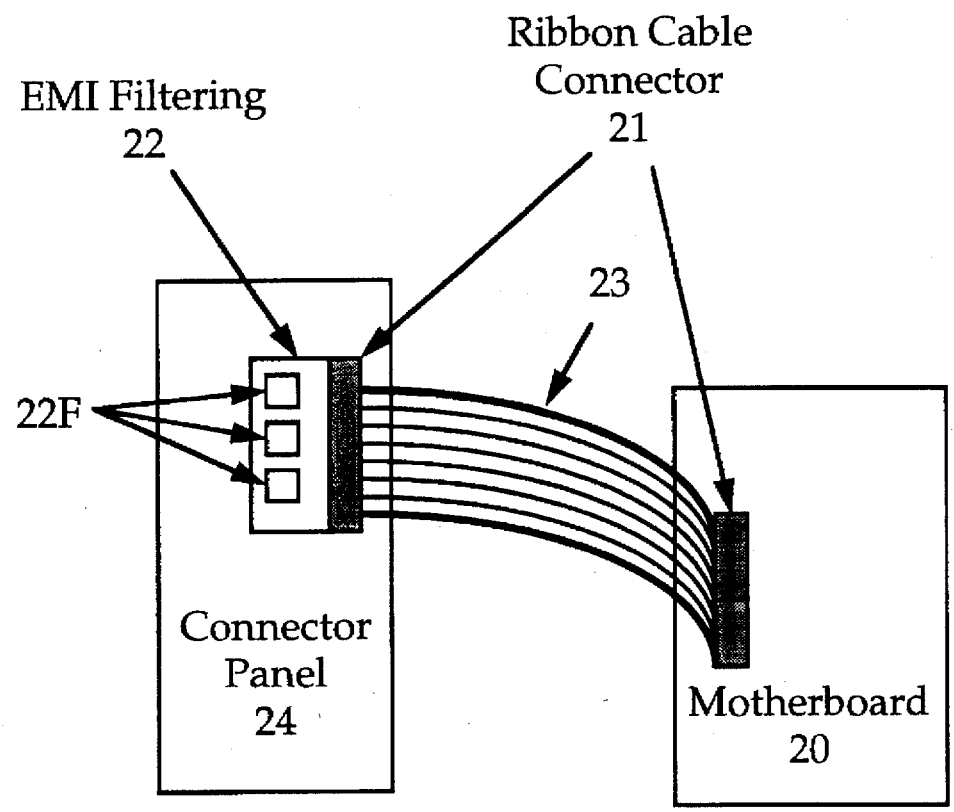
FIG. 2 shows the connector panel of the present invention having EMI filtering on the connector panel.

The present invention is an interface and an interface method that reduces EMI emission from an electrical system. In the method of the present invention, EMI filtering is performed just before signals are transmitted out of the shielded housing of the electrical system as opposed to the prior art method in which filtering is performed on the motherboard itself. FIG. 2 illustrates an electrical system having a motherboard 20, ribbon cable connector 21, ribbon cable 23, connector panel 24, and having EMI filtering block 22 on connector panel 24 in accordance with the present invention.

In this system, signals are transmitted along ribbon cable 23 from motherboard 20 to connector panel 24 each signal being transmitted to an individual port via cable connector 21. EMI filtering block 22 comprises one or more filters 22F, one per port on the connector panel where EMI filtering is desired. Each EMI filter removes any EMI being carried by a signal transmitted by ribbon cable 23 and passes a filtered signal out to any external device connected to connector panel 24. One conventional type of EMI filter is a notch type filter that only allows signals of a particular frequency to pass and filters out all other signal frequencies. It should be understood that any other filter type or filtering method that functions to eliminate EMI from a signal may be used.

In one embodiment of the present invention, the EMI components are connected and supported by a printed circuit board (PCB) which is attached to the connector panel. A plastic housing is fitted on top of the PCB which provides support for the connector contacts on the PCB. The plastic housing and consequently the EMI components are encased in a metal shielding. In one embodiment the metal shielding is a five sided metal container. The shielding is electrically attached to a grounded layer of metal within the PCB. The shielding and grounded metal layer function to reduce EMI emission from the EMI filtering PCB board. The metal shielding is attached in some manner, i.e. soldered, to the PCB so that it also functions to hold down the plastic housing. The ribbon cable couples signals from the motherboard to the EMI PCB connectors such that the signals are EMI filtered within the shielded encasing just before being passed out the connector panel ports.

It should be noted that by filtering the signal just prior to being passed out of the system housing, motherboard designers are provided more flexibility as to the placement of video and CPU IC devices on the motherboard. Specifically, instead of placing video and CPU IC devices at the edge of the motherboard so as to reduce the amount of EMI that is picked up on the ribbon cable, the present invention allows for placing the video IC in other locations on the motherboard since EMI is filtered on the connector panel.

Although the elements of the present invention have been described in conjunction with certain embodiments, it is appreciated that the invention can be implemented in a variety of other ways. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

We claim:

1. A connection interface on an electrical system housing, said interface comprising:

a substrate containing an electrical port for coupling to a cable connector external to said housing, said port being coupled to an electrical system internal to said housing; and a means for electrically filtering EMI from signals transmitted from said electrical system, said filtering means residing on said substrate and filtering said signals before they are coupled to said cable connector.

2. The interface as described in claim 1 wherein said substrate is a printed circuit board.

3. The interface as described in claim 2 wherein said filtering means is of the frequency limiting type.

4. The interface as described in claim 3 wherein said printed circuit board further includes a grounded layer of metal and said EMI filtering means on said printed circuit board is encased within metal EMI shielding wherein said metal shielding is electrically coupled to said grounded layer of metal.

5. The interface as described in claim 4 wherein said electrical system includes a printed circuit board having a first device for generating a first signal having a first frequency range and having a second device for generating a second signal having a second frequency range, wherein said first and second frequency ranges are relatively close and EMI caused by said first device interferes with said second signal.

6. The interface as described in claim 5 wherein said first device is a central processing unit and said second device is a video device.

7. A method for reducing EMI in a system having a connection interface, an electrical system, and a system housing, said method comprising the steps of:

providing a set of electrical ports for coupling to cable connectors external to said housing, said ports being coupled to said electrical system internal to said housing;

conducting electrical signals generated by said electrical system to said electrical ports via a cable; and electrically filtering electrical signals that have been conducted via said cable to remove electromagnetic interference prior to presenting said signals to said ports.

8. The method as described in claim 7 wherein said filtering comprises the step of limiting the frequencies of said signals.

9. The method as described in claim 8 wherein said electrical system generates a first signal having a first frequency range and generates a second signal having a second frequency range, wherein said first and second frequency ranges are relatively close and EMI caused by said first signal interferes with said second signal.

10. The method as described in claim 9 wherein said first signal is generated by a central processing unit and said second signal is generated by a video device.

11. A computer system comprising:

a first printed circuit board having electrical components for performing data processing functions;

an electro-magnetic interference (EMI) shielded housing containing said first printed circuit board;

a connector panel on said housing having ports for physical and electrical coupling to external cables;

a cable for electrically connecting system signals to and from said first printed circuit board to said connector panel ports; and a means for filtering EMI from said system signals, said filtering means residing on said connector panel, wherein system signals are filtered just before being coupled to said external cables.

12. The computer system of claim 11 wherein said EMI filtering means comprises a second printed circuit board having EMI filtering components, said second printed circuit board being constructed to include a layer of grounded metal, wherein said EMI filtering components are encased in a metal container that is electrically coupled to said grounded metal layer.

13. The computer system of claim 12 wherein said cable is unshielded from EMI.

* * * * *